United States Patent [19]

Chelny et al.

[11] Patent Number: 5,406,575
[45] Date of Patent: Apr. 11, 1995

[54] SEMICONDUCTOR HETEROSTRUCTURE LASER

[75] Inventors: Alexander A. Chelny, Suwon; Se-yang Park, Seoul, both of Rep. of Korea

[73] Assignee: Samsung Electronics Co., Ltd., Suwon, Rep. of Korea

[21] Appl. No.: 168,177

[22] Filed: Dec. 17, 1993

[30] Foreign Application Priority Data

Oct. 30, 1993 [KR] Rep. of Korea .................... 93-22947

[51] Int. Cl.$^6$ ............................................. H01S 3/19
[52] U.S. Cl. .................................... 372/45; 372/22; 359/326; 359/328
[58] Field of Search .................... 372/22, 45; 359/326, 359/328

[56] References Cited

U.S. PATENT DOCUMENTS 4,866,489 9/1989 Yokogawa et al. ................ 359/326
5,185,752 2/1993 Welch et al. ....................... 359/328

Primary Examiner—Rodney B. Bovernick
Assistant Examiner—Robert E. Wise
Attorney, Agent, or Firm—Foley & Lardner

[57] ABSTRACT

The semiconductor heterostructure laser includes a semiconductor substrate, a multilayered light emitting region and an active nonlinear waveguide. The multilayered light emitting region serves as a light source for producing fundamental light of a fundamental frequency. The active nonlinear waveguide comprises a number of multilayered heterostructures which absorb the fundamental light and double the frequency of the fundamental light, resulting in a doubled frequency light. The multilayered heterostructure also has a resonator structure. For effective operation, a first refractive mirror is formed between the semiconductor substrate and the multilayered light emitting region, and a second refractive mirror is formed between the multilayered light emitting region and the active nonlinear waveguide.

20 Claims, 7 Drawing Sheets

SEMICONDUCTOR HETEROSTRUCTURE LASER

BACKGROUND OF THE INVENTION

The present invention relates to a semiconductor device, and more particularly, to a semiconductor heterostructure laser which generates a high-frequency laser beam.

To obtain a high-frequency laser beam in the visible light region, a technique has been recently used in which the frequency of the laser beam generated from a light source such as a laser diode is doubled. An optically nonlinear crystal has been conventionally used as the structure for doubling the frequency.

However, this optically nonlinear crystal cannot efficiently perform the frequency doubling, due to the mismatch between the light source and the optically nonlinear crystal.

SUMMARY OF THE INVENTION

Accordingly, the object of the present invention is to provide a semiconductor heterostructure laser for effectively generating light which has a frequency double that of a fundamental light frequency.

To obtain the above object of the present invention, a semiconductor heterostructure laser is provided which comprises a semiconductor substrate, a multilayered light emitting region disposed on the semiconductor substrate, for producing fundamental light of a fundamental frequency and an active nonlinear waveguide including at least one multilayered heterostructure. The multilayered heterostructure has a resonator structure and absorbs and doubles the fundamental light frequency to produce a doubled frequency light.

The semiconductor heterostructure laser preferably further comprises a first refractive mirror disposed between the semiconductor substrate and the multilayered light emitting region, for preventing the propagation of the fundamental light from the multilayered light emitting region to the semiconductor substrate and a second refractive mirror disposed between the multilayered light emitting region and the active nonlinear waveguide, for preventing the propagation of the doubled frequency light from the active nonlinear waveguide to the multilayered light emitting region.

The first refractive mirror includes a plurality of first AlGaAs layers having a first conductivity, each having a first aluminum composition ratio and a plurality of second AlGaAs layers having a first conductivity, each having a second aluminum composition ratio which is lower than the first aluminum composition ratio. The first AlGaAs layers and the second AlGaAs layers are alternately formed on the semiconductor substrate, with a superlattice structure.

The second refractive mirror includes a plurality of third AlGaAs layers, each having a third aluminum composition ratio and a plurality of fourth AlGaAs layers, each having a fourth aluminum composition ratio which is higher than the third aluminum composition ratio, wherein the third AlGaAs layers and the fourth AlGaAs layers are alternately formed on the semiconductor substrate, with a superlattice structure.

The multilayered light emitting region includes at least one lower cladding layer doped with impurities of a first conductivity, at least one light-emitting active layer for generating light of a fundamental frequency and at least one upper cladding layer doped with impurities of a second conductivity, each having a larger band-gap than that of the light emitting active layer in order to transport the fundamental light. The lower cladding layer, the light-emitting layer and the upper cladding layer are sequentially and alternately formed over the semiconductor substrate. Here, the lower cladding layer, the light-emitting active layer and the upper cladding layer each comprise AlGaAs. Also, the multilayered light emitting region further comprises a contact layer doped with impurities of the second conductivity, wherein the doping concentration of the contact layer is lower than that of the upper cladding layer.

The multilayered light emitting region can also comprise AlGaAs/GaAs-strained InGaAs material.

The multilayered heterostructure included in the active nonlinear waveguide comprises a first waveguide layer having a first refractive index; a lasing active layer formed on the first waveguide layer, having a band-Hxp suitable for absorbing the fundamental light emitted from the multilayered light emitting region; a second waveguide layer formed on the lasing active layer, having a second refractive index equal to the first refractive index; and a third waveguide layer formed on the second waveguide layer, having a third refractive index lower than the first refractive index.

Another embodiment of the multilayered heterostructure may be constituted by a first waveguide layer having a first refractive index. A second waveguide layer is formed on the first waveguide layer, having a second refractive index higher than the first refractive index. A lasing active layer is formed on the second waveguide layer, having a band-gap suitable for absorbing the fundamental light emitted from the multilayered light emitting region. A third waveguide layer is formed on the lasing layer, having a third refractive index equal to the second refractive index and a fourth waveguide layer is formed on the third waveguide layer, having a fourth refractive index equal to the first refractive index. Here, the first, second, third and fourth waveguide layers comprise AlGaAs and the lasing active layer may comprise InGaAs.

The semiconductor substrate has a plane orientation (111) and the active nonlinear waveguide has a front facet and a rear facet, wherein the front facet and rear facet are coated with a dielectric multilayered mirror for reflecting the fundamental light.

With respect to the construction of the semiconductor heterostructure laser according to the present invention, the following variations are possible.

In a first embodiment of the semiconductor heterostructure laser of the present invention, the second refractive mirror and the active nonlinear waveguide constitute a ridge structure. An antireflection dielectric coating layer is formed on the upper surface of the active nonlinear waveguide and an ohmic contact layer is formed on the lower surface of the semiconductor substrate.

In a second embodiment of the semiconductor heterostructure laser of the present invention, a current blocking layer is selectively located on the semiconductor substrate to form a groove-shaped channel. The first refractive mirror and the multilayered light emitting region are sequentially grown, while maintaining the grooved shape of the channel. The second refractive mirror and the active nonlinear waveguide are sequentially formed with the formation of a ridge and maintaining the grooved shape of the channel. The lower surface of the semiconductor substrate is coated with a first ohmic contact layer, while the remainder of the surface of the multilayered light emitting layer is covered with a second ohmic contact layer. The upper surface of the active nonlinear waveguide is coated with an antireflection dielectric layer.

In a third embodiment of the semiconductor heterostructure laser of the present invention, a current blocking layer is selectively formed in the semiconductor substrate to form a channel. The first refractive mirror has a groove structure located over the channel. The multilayered light emitting region, the second refractive mirror and the active nonlinear waveguide are sequentially formed, while maintaining the shape of the grooved structure of the first refractive mirror. An antireflection dielectric coating layer is formed on the surface of the active nonlinear waveguide layer. Here, the second refractive mirror, the active nonlinear waveguide and the antireflection dielectric coating constitute a ridge. In addition, a first ohmic contact layer is formed underneath the semiconductor substrate, while a second ohmic contact layer is formed on the remainder of the upper surface of the multilayered light emitting region.

In a fourth embodiment of the semiconductor heterostructure laser of the present invention, a first ohmic contact layer is formed on the lower surface of the semiconductor substrate. A current blocking layer is selectively formed on the upper surface of the semiconductor substrate to form a groove-shaped channel. The first refractive mirror and the multilayered light emitting region are sequentially formed, while maintaining the grooved shape of the channel. An intermediate layer is selectively formed on the upper surface of the multilayered light emitting region, so as to become a portion of the ridge which also includes the second refractive mirror, the active nonlinear waveguide and the antireflection dielectric coating layer.

BRIEF DESCRIPTION OF THE DRAWINGS

The above objects and other advantages of the present invention will become more apparent by describing in detail preferred embodiments thereof with reference to the attached drawings in which.

DETAILED DESCRIPTION OF THE INVENTION

Figure 1:
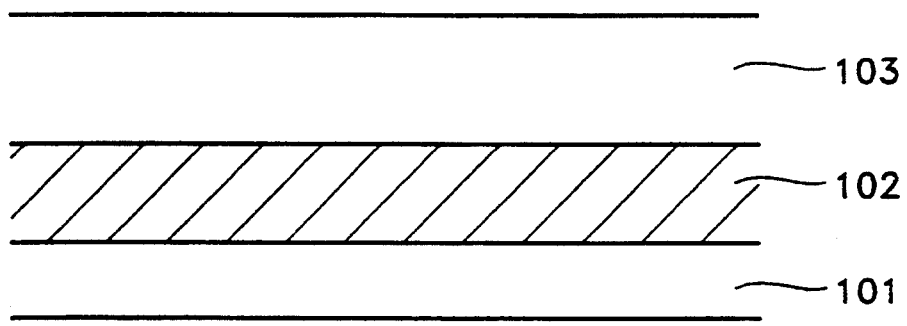
FIG. 1 is a schematic cross-sectional view of a semiconductor heterostructure laser according to one aspect of the present invention.

FIG. 1 is a schematic cross-sectional view of a semiconductor heterostructure laser according to one aspect of the present invention. The semiconductor heterostructure laser includes a semiconductor substrate 101, a multilayered light emitting region 102 and an active nonlinear waveguide 103.

Referring to FIG. 1, semiconductor substrate 101 has a plane orientation (111) and is doped with impurities, for example, n-type impurities in the concentration of $10^{18}$ dopants/cm$^3$. The semiconductor substrate can comprise $A^3B^5$ or $A^2B^6$, where $A^3$ represents the material included in the third group of the periodic table; $B^5$ represents the material included in the fifth group of the periodic table; $A^2$ represents the material included in the second group of the periodic table.; and $B^6$ represents the material included in the sixth group of the periodic table.

Multilayered light emitting region 102 is grown on the upper surface of semiconductor substrate 101 and is constituted by a number of layers including a light-emitting active layer for producing fundamental light of a fundamental frequency. Multilayered light emitting region 102 is equivalent to a conventional LED (light emitting diode) structure, and especially to the conventional SELED (surface-emitting LED). Accordingly, the fundamental light is emitted through the surface of multilayered light emitting region 102. Active nonlinear waveguide 103 is grown on the upper surface of multilayered light emitting region 102 and is constituted by a number of layers including a lasing active layer. Here, the lasing active layer included in active nonlinear waveguide 103 absorbs the fundamental light transferred through the upper surface of multilayered light emitting region 102. The absorbed fundamental light is guided along the lasing active layer included in the active nonlinear waveguide 103. Active nonlinear waveguide 103 has a resonator structure, that is, it has cleaved mirrors, whereby the guided fundamental light is reflected on the cleaved mirrors. Accordingly, there are two counter-propagating waves of the TE (transverse electric) or TM (transverse magnetic) type, in the lasing active layer. The counter-propagating waves result in radiation of a doubled frequency light which propagates in a direction perpendicular to the waveguide surface, i.e., in the growth direction.

To achieve an effective conversion of the fundamental light into the doubled frequency light, each layer of active nonlinear waveguide 103 should have a thickness satisfying the quasiphase matching condition. In other words, the thickness of the layers should be:

$$\frac{\lambda_{2\omega}}{2n}$$

where $\lambda_{2\omega}$ is the wavelength of the doubled frequency light; and n is the refractive index of the layer.

Figure 2:
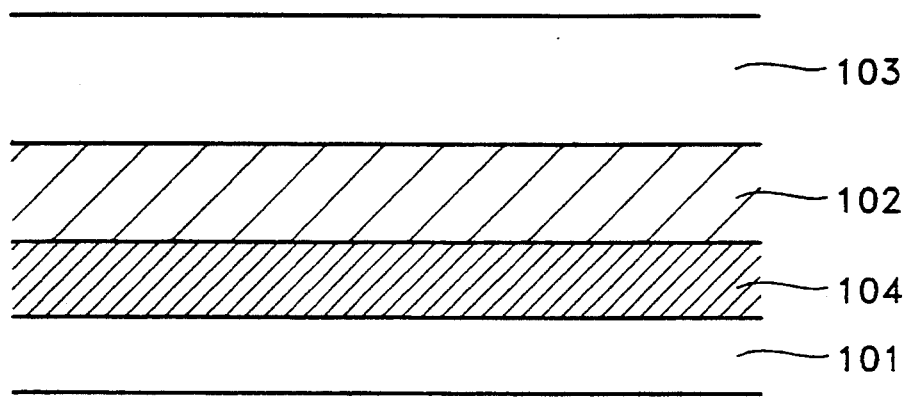
FIG. 2 is a schematic cross-sectional view of a semiconductor heterostructure laser according to another aspect of the present invention.

FIG. 2 is a schematic cross-sectional view of a semiconductor heterostructure laser showing another aspect of the present invention. The semiconductor heterostructure laser further comprises a first refractive mirror 104 located between semiconductor substrate 101 and multilayered light emitting region 102, in addition to the elements of the semiconductor heterostructure laser shown in FIG. 1.

First refractive mirror 104 prevents the propagation of the fundamental light from multilayered light emitting region 102 to semiconductor substrate 101. As a result, first refractive mirror 104 increases the pumping efficiency of the fundamental light.

Figure 3:
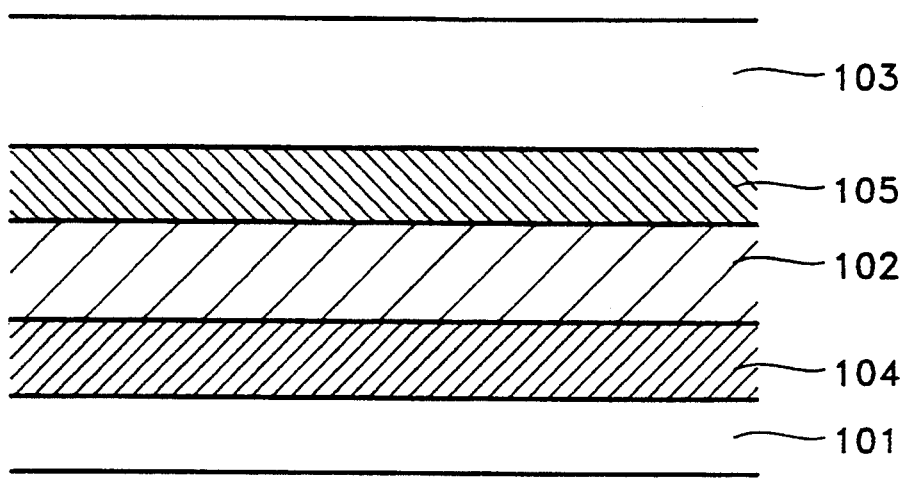
FIG. 3 is a schematic cross-sectional view of a semiconductor heterostructure laser according to still another aspect of the present invention.

FIG. 3 is a schematic cross-sectional view of a semiconductor heterostructure laser showing still another aspect of the present invention. The semiconductor heterostructure laser further includes a first refractive mirror 104 and a second refractive mirror 105 in addition to the elements of the semiconductor heterostructure laser shown in FIG. 1.

In FIG. 3, first refractive mirror 104 is located between semiconductor substrate 101 and multilayered light emitting region 102, while second refractive mirror 105 is located between multilayered light emitting region 102 and active nonlinear waveguide 103. As mentioned above, first refractive mirror 104 prevents the propagation of the fundamental light from multilayered light emitting region 102 to semiconductor substrate 101. Here, second refractive mirror 105 prevents the propagation of the doubled frequency light from active nonlinear waveguide 103 to multilayered light emitting region 102, but does not prevent propagation from multilayered light emitting region 102 to active nonlinear waveguide 103. As a result, second refractive mirror 105 increases the lasing efficiency and the output efficiency of the doubled frequency light.

Figure 4:
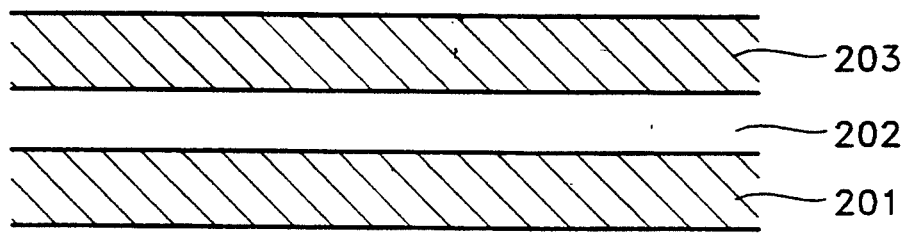
FIG. 4 is a schematic cross-sectional view of one embodiment of the multilayered light emitting region 102 shown in FIGS. 1-3.

FIG. 4 is a schematic cross-sectional view of one embodiment of the multilayered light emitting region 102 shown in FIGS. 1-3. Multilayered light emitting region 102 includes a lower cladding layer 201, a light-emitting active layer 202 and an upper cladding layer 203.

Referring to FIG. 4, light-emitting active layer 202 is grown on the upper surface of lower cladding layer 201 and upper cladding layer 203 is formed on the upper surface of light-emitting active layer 202. Here, lower cladding layer 201 and upper cladding layer 202 are doped with different conductivity of impurities, respectively. Furthermore, there exists the band-gap discontinuity between the light-emitting active layer 202 and two cladding layers 201 and 203. The band-gap discontinuity prevents the current leakage from the light-emitting active layer 202.

As is the case with the conventional double heterostructure, this multilayered light emitting region 102 generates fundamental light of a fundamental frequency due to a recombination of the electrons and holes. The fundamental light is transmitted through upper cladding layer 203 which is therefore transparent with respect to the fundamental light. That is, the band-gap is higher than that of the light-emitting active layer.

For example, lower cladding layer 201 comprises $Al_{0.3}Ga_{0.7}As$ doped with n-type impurities in the concentration of $5 \times 10^{17}$ dopants/cm$^3$ and light-emitting active layer 202 comprises $Al_{0.15}Ga_{0.85}As$ without a dopant. Upper cladding layer 203 is comprised of $Al_{0.3}Ga_{0.7}As$ doped with p-type impurities in the concentration of $5 \times 10^{17}$ dopants/cm$^3$.

In addition, multilayered light emitting region 102 should have a thickness and doping level suitable for the uniform spreading of current throughout. Especially, the thickness of light-emitting active layer 202 should be greater than 1 $\mu$m, in order to prevent the lasing generation at the p-n junction in multilayered light emitting region 102. For example, both lower cladding layer 201 and upper cladding layer 203 may be thicker than 1 $\mu$m, and light-emitting active layer 202 may have a thickness in the range of 0.5 $\mu$m–1 $\mu$m.

Figure 5:
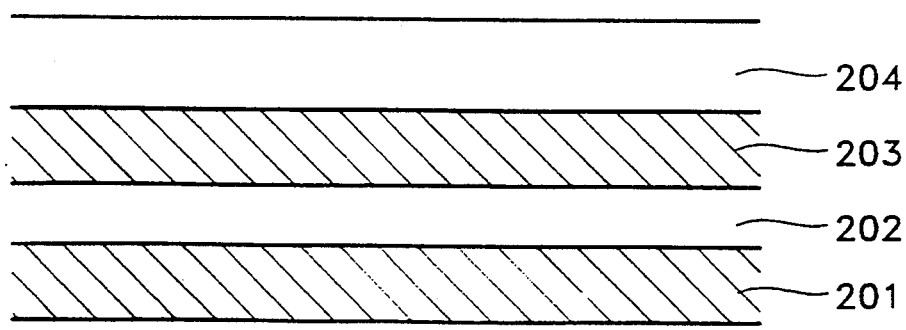
FIG. 5 is a schematic cross-sectional view of another embodiment of the multilayered light emitting region 102 shown in FIGS. 1-3.

FIG. 5 is a schematic cross-sectional view of another embodiment of the multilayered light emitting region 102 shown in FIGS. 1-3. Multilayered light emitting region 102 further includes a contact layer 204, in addition to the elements of multilayered light emitting region 102 shown in FIG. 4.

Referring to FIG. 5, contact layer 204 is grown on the upper surface of upper cladding layer 203. Contact layer 204 is doped with impurities having the same conductivity as that of upper cladding layer 203 but in a lower concentration. For example, $Al_{0.3}Ga_{0.7}As$ is doped with p-type impurities in the concentration of $2 \times 10^{19}$ dopants/cm$^3$.

Figure 6:
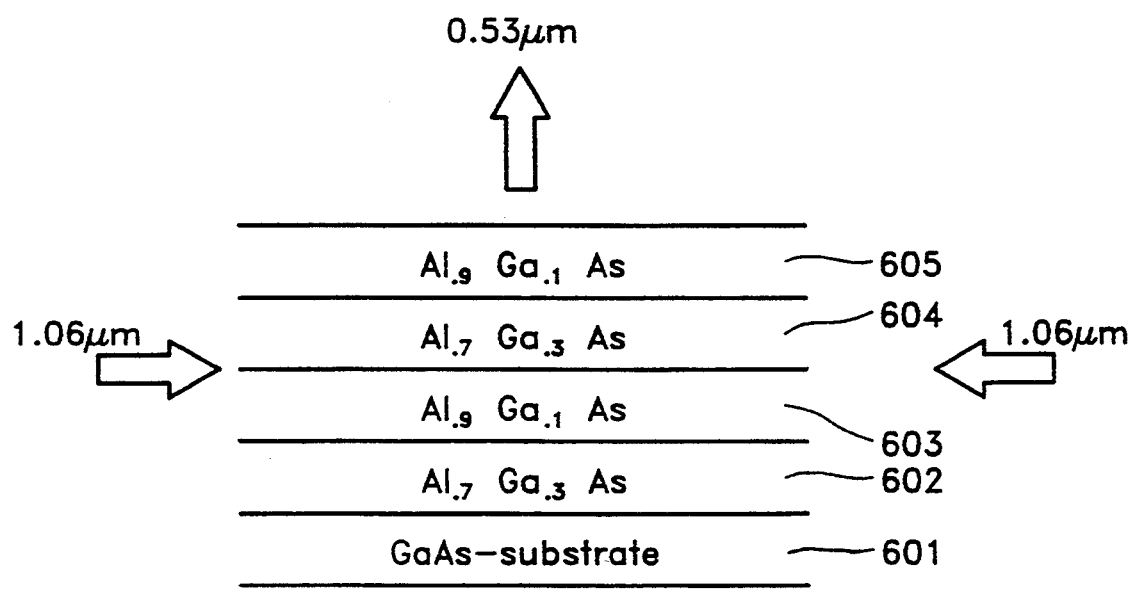
FIG. 6 is a schematic diagram for explaining the conventional nonactive frequency doubling structure.

FIG. 6 is a schematic diagram explaining a conventional nonactive frequency-doubling structure.

In FIG. 6, the conventional nonactive frequency-doubling structure includes a GaAs-substrate 601, a number of $Al_{0.7}Ga_{0.3}As$ layers 602 and 604 and a number of $Al_{0.9}Ga_{0.1}As$ layers 603 and 605. $Al_{0.7}Ga_{0.3}As$ layers 602 and 604 and $Al_{0.9}Ga_{0.1}As$ layers 603 and 605 are alternately grown on the upper surface of GaAs-substrate 601. In this structure, counter-propagated lights of a 1.06 $\mu$m YAG:Nd laser are introduced. If the counter-propagated light meets, frequency-doubling is performed, thus producing a doubled frequency light having a propagation direction perpendicular to the counter-propagated light. Here, if the plane orientation of GaAs-substrate 601 is (111), both counter-propagated lights can be TE (transverse electric) mode waves, whereas, if the plane orientation of GaAs-substrate 601 is (100), one counter-propagated light should be a TE-mode wave and the other should be a -TM (transverse magnetic) mode wave.

Figure 7:
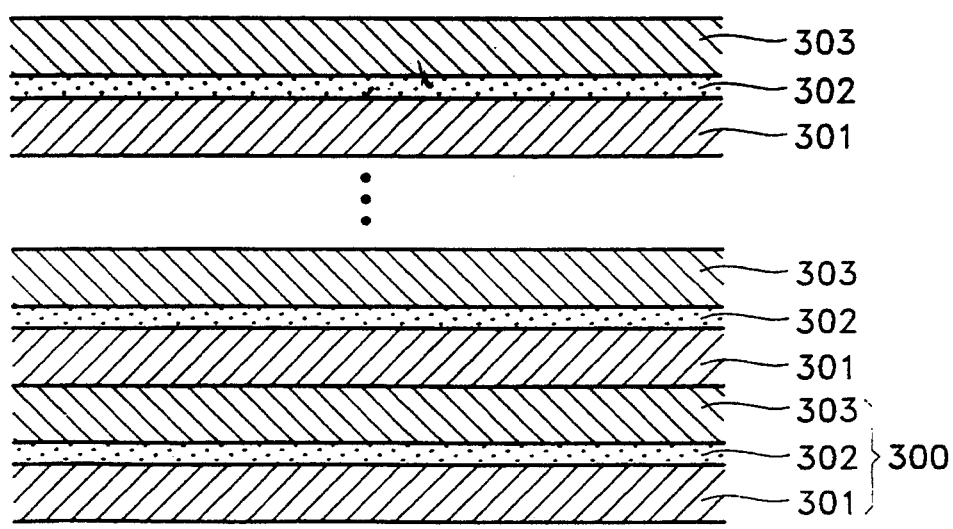
FIG. 7 is a schematic cross-sectional view of one embodiment of the active nonlinear waveguide 103 shown in FIGS. 1-3.

FIG. 7 is a schematic cross-sectional view of one embodiment of the active nonlinear waveguide 103 shown in FIGS. 1-3. The active nonlinear waveguide includes a number of multilayered heterostructures 300.

In FIG. 7, one multilayered heterostructure 300 is constituted by a waveguide layer 301, a lasing active layer 302 and a waveguide layer 303. Lasing active layer 302 is formed between waveguide layer 301 and waveguide layer 303. That is, waveguide layer 301, lasing active layer 302 and waveguide layer 303 are sequentially grown without doping. Here, waveguide layer 301 has a refractive index equal to that of waveguide layer 303 and lasing active layer 302 has a band-gap suitable for absorbing the fundamental light emitted from the multilayered light emitting region 102.

Furthermore, waveguide layers 301 and 303 have a higher band-gap than that of light-emitting active layer 202 included in multilayered light emitting region 102, to transmit the fundamental light.

Figure 8:
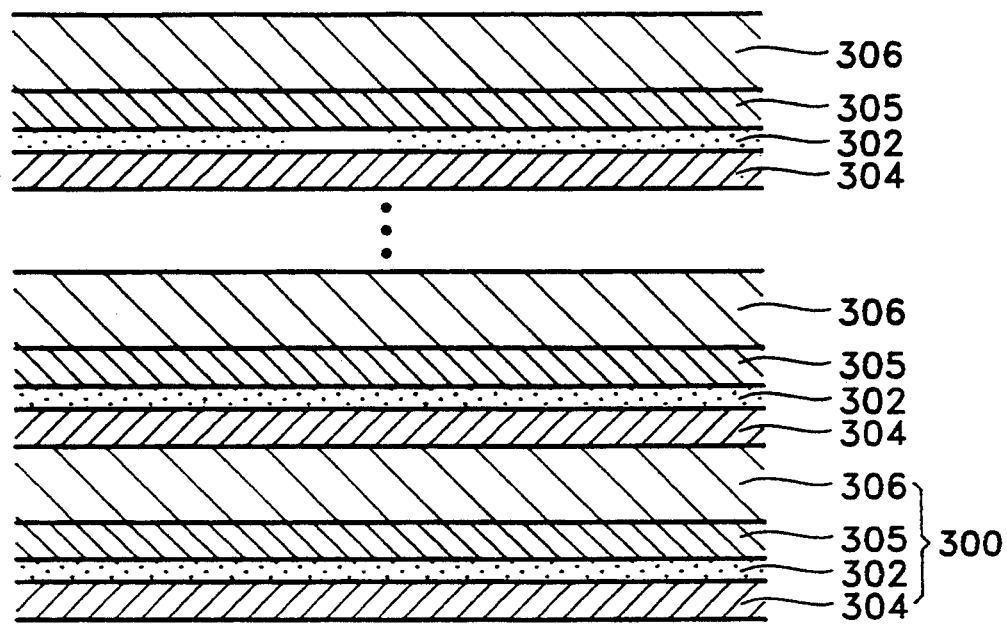
FIG. 8 is a schematic cross-sectional view of another embodiment of the active nonlinear waveguide 103 shown in FIGS. 1-3.

FIG. 8 is a schematic cross-sectional view of another embodiment of the active nonlinear waveguide 103 shown in FIGS. 1-3, wherein the active nonlinear waveguide 103 includes a number of multilayered heterostructures 300.

Referring to FIG. 8, one multilayered heterostructure 300 included in active nonlinear waveguide 103 is constituted by waveguide layers 304, 305 and 306 and a lasing active layer 302. Lasing active layer 302 is grown on the upper surface of waveguide layer 304 and waveguide layers 305 and 306 are sequentially grown on the upper surface of lasing active layer 302. Here, waveguide layer 304 has a refractive index equal to that of waveguide layer 305 and waveguide layer 306 has a refractive index lower than that of waveguide layer 305. Also, the lasing active layer, as in the case of FIG. 7, has a band-gap suitable for absorbing the fundamental light emitted from the multilayered light emitting region 102.

As is the case with FIG. 7, waveguide layers 304, 305 and 306 have a higher band-gap than that of light-emitting active layer 202 included in multilayered light emitting region 102.

Figure 9:
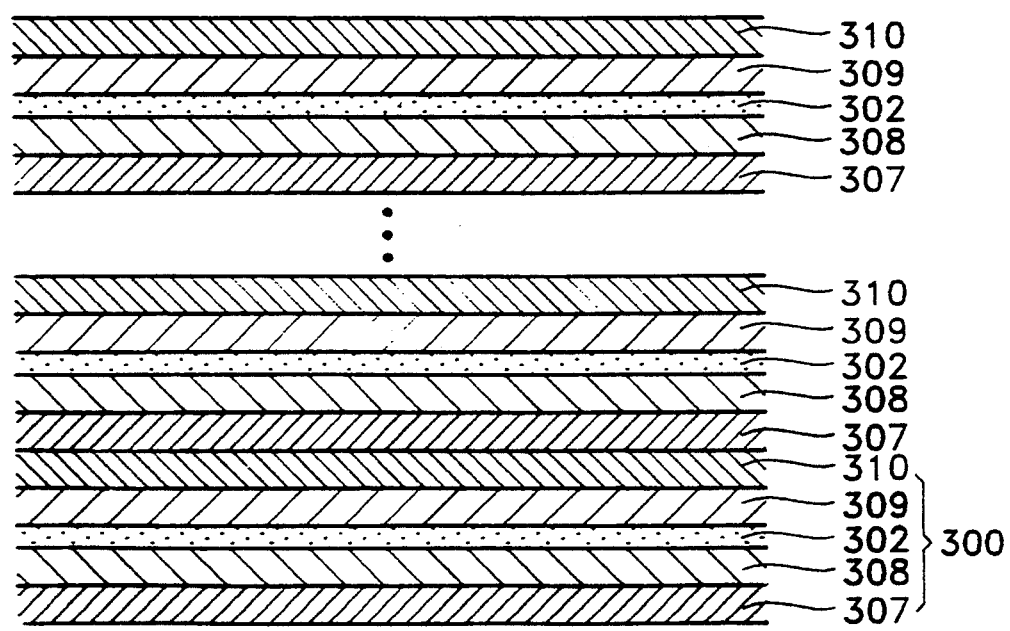
FIG. 9 is a schematic cross-sectional view of still another embodiment of the active nonlinear waveguide 103 shown in FIGS. 1-3.

FIG. 9 is a schematic cross-sectional view of still another embodiment of the active nonlinear waveguide 103 shown in FIGS. 1-3. The active nonlinear waveguide includes a number of multilayered heterostructures 300 which are sequentially grown.

In FIG. 9, one multilayered heterostructure is constituted by four waveguide layers 307, 308, 309 and 310 and a lasing active layer 302. On the upper surface of waveguide layer 307 are sequentially grown waveguide 308, lasing active layer 302, waveguide layer 309 and waveguide layer 310. Here, waveguide layer 307 has a refractive index equal to that of waveguide layer 310 and waveguide layer 308 has a refractive index equal to that of waveguide layer 309. The refractive index of waveguide layers 307 and 310, however, is lower than that of waveguide layers 308 and 309.

In one example of materials for the active nonlinear waveguide, waveguide layers 307 and 310 comprise $Al_{0.9}Ga_{0.1}As$ without doping, and waveguide layers 308 and 309 comprise $Al_{0.7}Ga_{0.3}As$ without doping. In this case, lasing active layer 302 may comprise $In_{0.25}Ga_{0.75}As$ without doping.

Also, waveguide layers 307, 308, 309 and 310 have a higher band-gap than that of light-emitting active layer 202 included in multilayered light emitting region 102.

Figure 10:
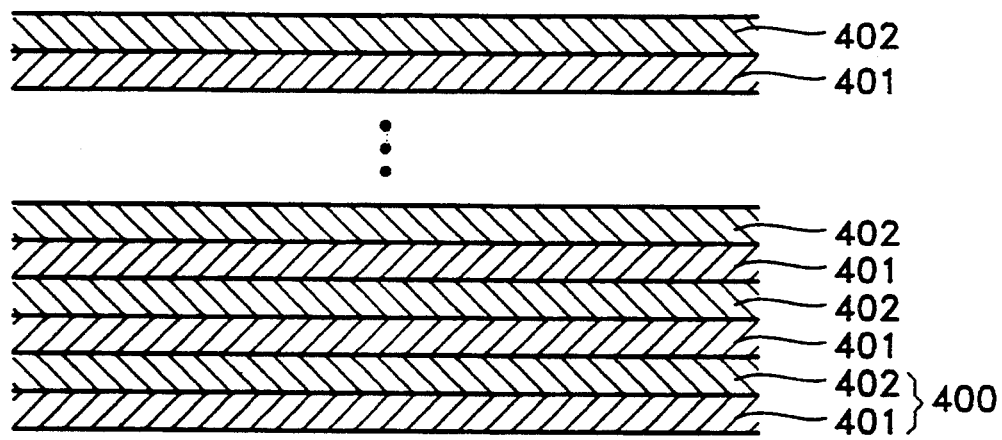
FIG. 10 is a schematic cross-sectional view of the first refractive mirror 104 shown in FIG. 2 and FIG. 3.

FIG. 10 is a schematic cross-sectional view of the first refractive mirror 104 shown in FIGS. 2-3. The first refractive mirror includes a number of first double-layered mirrors 400 in a superlattice formation.

Referring to FIG. 10, first double-layered mirror 400 is constituted by two layers 401 and 402 which have refractive indexes which differ from each other by as much as possible. In addition, layers 401 and 402 each have a thickness of $\lambda_B/n_i$, where $\lambda_B$ is the wavelength of the fundamental light emitted from multilayered light emitting region 102; and $n_i$ is a refractive index of each layer, with regard to the wavelength of the fundamental light.

The difference of refractive indexes is due to the difference in their material composition ratios.

As an example of the materials used, layer 401 comprises $Al_{0.7}Ga_{0.3}As$ doped with n-type impurities in the concentration of $10^{18}$ dopants/cm$^3$ and layer 402 comprises $Al_{0.12}Ga_{0.88}As$ doped with n-type impurities in the concentration of $10^{18}$ dopants/cm$^3$. Here, the dopants can be one selected among Si, Te, Se, S or any equivalents.

Here, as the number of first double-layered mirror is increased, the reflective coefficient of the first refractive mirror 104 increases. In a more detailed example, twelve doubled-layered mirrors give a reflectivity of 76% and 40 such mirrors will achieve 99.99% reflectivity.

Figure 11:
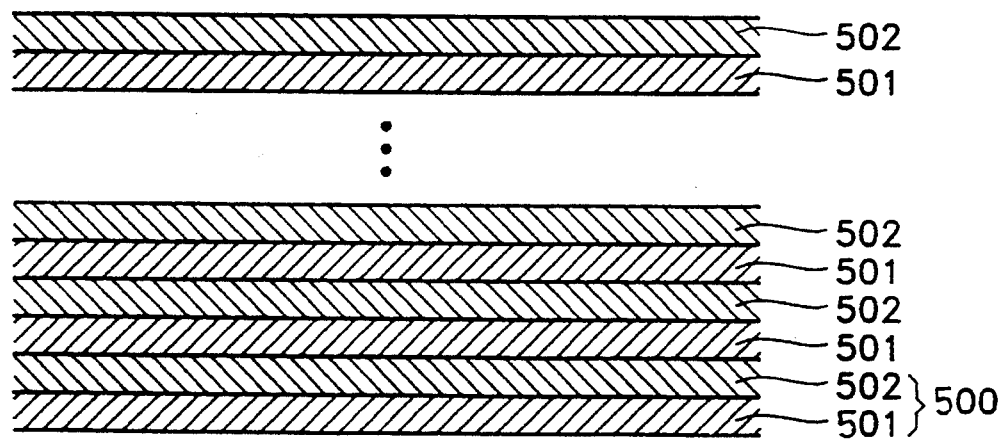
FIG. 11 is a schematic cross-sectional view of the second refractive mirror 105 shown in FIG. 3.

FIG. 11 is a schematic cross-sectional view of the second refractive mirror 105 shown in FIG. 3. The second refractive mirror 105 includes a number of second double-layered mirrors 500 which are constituted by layers 501 and 502, each having a refractive index which differs from the other by as much as possible. The second double-layered mirrors 500 are also in a superlattice formation.

In FIG. 11, for example, layer 501 may comprise $Al_{0.7}Ga_{0.3}As$ without doping and layer 502 may comprise $Al_{0.9}Ga_{0.1}As$ without doping. This second refractive mirror 105 reflects 0.53 μm light.

As in the case of the first refractive mirror, more second double-layered mirrors results in a higher reflective coefficient of the second refractive mirror 105. Here, the thickness should be $$\frac{\lambda_{2\omega}}{4n}$$

where $\lambda_{2\omega}$ represents the wavelength of the doubled frequency light and n represents the refractive index of the layer. Accordingly, these double-layered mirrors transport the fundamental light which does not correlate to the $\lambda_{2\omega}/4n$ thickness, while reflecting the doubled frequency light.

In contrast to the above examples, first and second refractive mirrors 104 and 105 can be constructed of AlInGaP/AlInP/GaAs layers. Otherwise, they may comprise GaAs, InP, GaP, GaAsP, InGaAs, InGaAsP, GaN, AlN, InN, InGaP, InGaAlP, AlGaAs, GaAlAsP, GaAlN, InGaAlN, ZnSe, ZnSeSTe or their equivalents.

Generally speaking, a special morphological structure for a semiconductor heterostructure laser can be used to decrease threshold current and focus the fundamental light emitted from the multilayered light emitting region in the active nonlinear waveguide. Therefore, with reference to FIGS. 12-15, an embodiment of the semiconductor heterostructure laser of the present invention will be explained.

Figure 12:
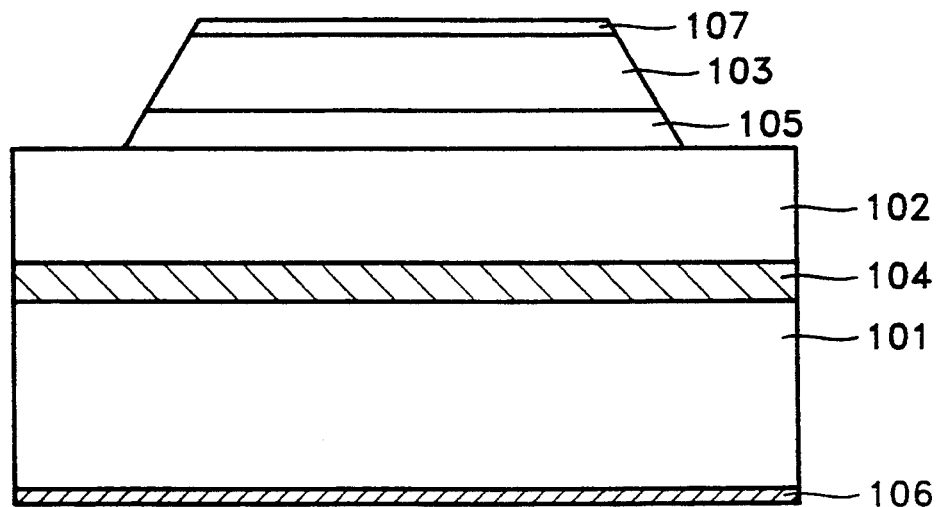
FIG. 12 is a cross-sectional view of the semiconductor heterostructure laser, according to a first morphological embodiment of the present invention.

FIG. 12 is a cross-sectional view of the semiconductor heterostructure laser, according to a first embodiment of the present invention.

In FIG. 12, the semiconductor heterostructure laser includes a semiconductor substrate 101, a first refractive mirror 104, a multilayered light emitting region 102, a second refractive mirror 105 and an active nonlinear waveguide 103. In addition, an ohmic contact layer 106 such as a metal layer is formed on the lower surface of semiconductor substrate 101 and an antireflection dielectric coating layer 107 is formed on the upper surface of active nonlinear waveguide layer 103.

Antireflection dielectric coating layer 107 reduces the reflection of the top surface, thereby improving the overall output efficiency of the device.

Also, the front and rear surfaces are made by cleaving, so as to form a Fabri-Perot resonator. These cleaved surfaces decrease the external emission of light, resulting in the reduction of the threshold current for lasing. These cleaved surfaces of the resonator should be coated by reflecting dielectric mirrors.

This structure can be made by the following sequence.

First refractive mirror 104, multilayered light emitting region 102, second refractive mirror 105 and active nonlinear waveguide 103 are sequentially grown on semiconductor substrate 101 having a plane orientation of (111), by MBE (molecular beam epitaxy), MOMBE (metal-organic MBE) or MOCVD (metal organic chemical vapor deposition). Then, antireflection dielectric coating layer 107 is selectively formed on the upper surface of active nonlinear waveguide 103. In more detail, a stripe-shaped antireflection dielectric coating layer 107 is made by a lithography process.

Subsequently, using antireflection dielectric coating layer 107 as an etch-protection mask, second refractive mirror 105 and active nonlinear waveguide 103 are selectively eliminated by an etching process such as wet etching, ion-reactive etching or equivalents thereof. This etching results in the formation of a ridge structure.

In another method for fabricating the semiconductor heterostructure laser, after multilayered light emitting layer 102 has been grown, on the upper surface of multilayered light emitting layer 102, second refractive mirror 105 and active nonlinear waveguide 103 are selectively grown using a specific growth-prevention mask, to form a ridge structure. Then, antireflection dielectric coating layer 107 is formed on the upper surface of active nonlinear waveguide 103.

Figure 13:
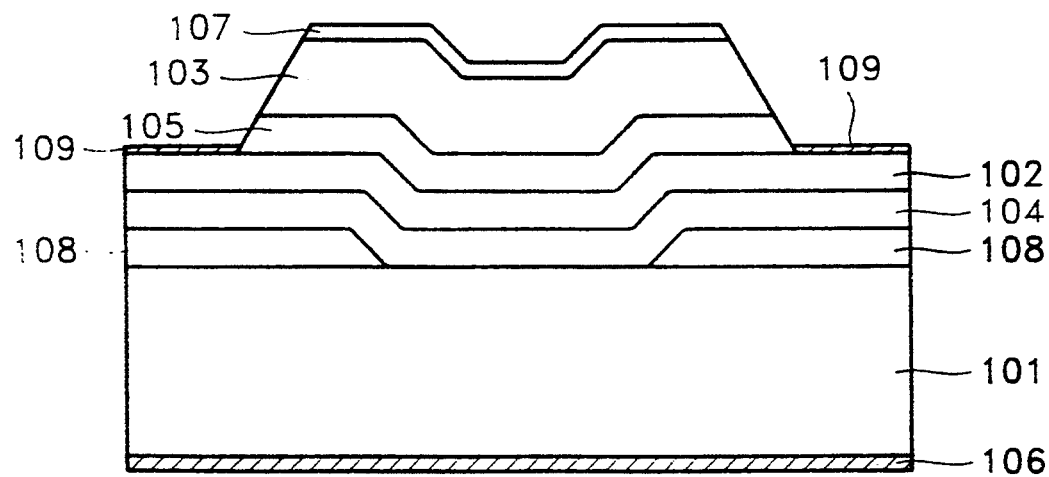
FIG. 13 is a cross-sectional view of the semiconductor heterostructure laser, according to a second morphological embodiment of the present invention.

FIG. 13 is a cross-sectional view of the semiconductor heterostructure laser, according to a second embodiment of the present invention. The structure of this embodiment improves current confinement.

The semiconductor heterostructure laser of FIG. 13 further includes an ohmic contact layer 109 and a current blocking layer 108 which is selectively formed on the upper surface of semiconductor substrate 101, so as to form a groove-shaped channel. In addition, first refractive mirror 104, multilayered light emitting region 102, second refractive mirror 105, active nonlinear waveguide 103 and antireflection dielectric coating layer 107 are sequentially grown, while maintaining the grooved shape of the channel. This channel effectively confines the externally injected current.

As is the case of FIG. 12, the semiconductor heterostructure laser has a ridge structure constituted by second refractive mirror 105, active nonlinear waveguide layer 103 and antireflection dielectric coating layer 107. Also, the remainder of the upper surface of multilayered light emitting region 102 is covered with an ohmic contact layer 109 such as a metal layer.

In this embodiment, the current transferred through first refractive mirror 104 and multilayered light emitting region 102, cannot pass through the area under ohmic contact layer 109, due to the preventive action of current blocking layer 108. Current blocking layer 108 has a different type conductivity from that of semiconductor substrate 101.

Figure 14:
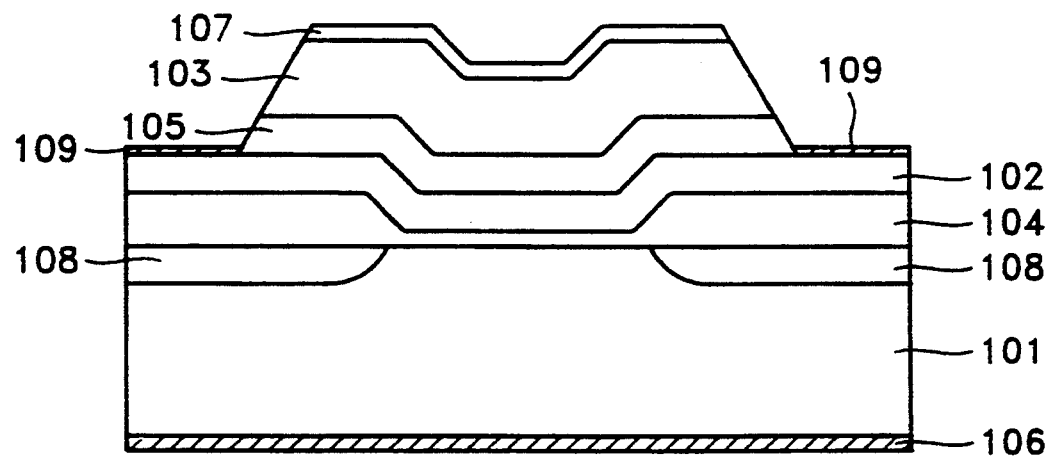
FIG. 14 is a cross-sectional view of the semiconductor heterostructure laser, according to a third morphological embodiment of the present invention.

FIG. 14 is a cross-sectional view of the semiconductor heterostructure laser, according to a third embodiment of the present invention. The semiconductor heterostructure laser has a similar structure, except that the current blocking layer 108 is selectively formed not on semiconductor substrate 101 but in semiconductor substrate 101 and the groove is formed in first refractive mirror 104.

Figure 15:
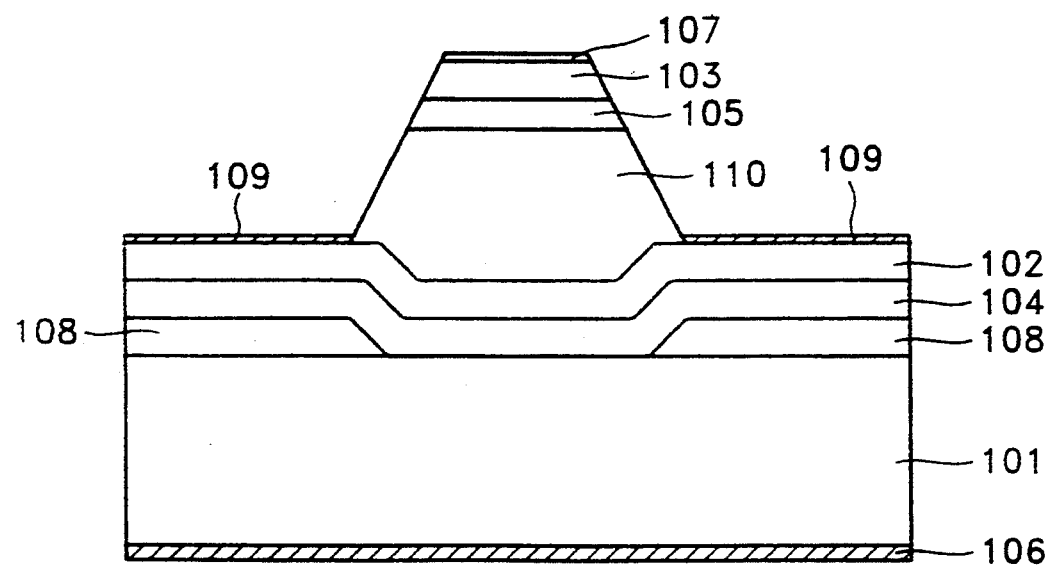
FIG. 15 is a cross-sectional view of the semiconductor heterostructure laser, according to a fourth morphological embodiment of the present invention.

FIG. 15 is a cross-sectional view of the semiconductor heterostructure laser, according to a fourth embodiment of the present invention. The semiconductor heterostructure laser includes a semiconductor substrate 101, a current blocking layer 108, a first refractive mirror 104, a multilayered light emitting region 102, an intermediate layer 110, ohmic contact layers 106 and 109, an antireflection dielectric coating layer 107, a second refractive mirror 105 and an active nonlinear waveguide layer 103.

Referring to FIG. 15, current blocking layer 108 is selectively formed on the upper surface of semiconductor substrate 101, so as to form a groove-shaped channel for current confinement. On the surfaces of current blocking layer 108 and semiconductor substrate 101, first refractive mirror 104 and multilayered light emitting region 102 are sequentially formed while maintaining the grooved shape of channel. Intermediate layer 110 is selectively formed on the upper surface of multilayered light emitting region 102. Second refractive mirror 105, active nonlinear waveguide 103 and antireflection dielectric coating layer 107 are sequentially formed on the surface of intermediate layer 110. As a result, a ridge structure is made, where the ridge is constituted by intermediate layer 110, second refractive mirror 105, active nonlinear waveguide layer 103 and antireflection dielectric coating layer 107. While, on the rest portion of the surface of multilayered light emitting region 102, ohmic contact layer 109 such as a metal layer is formed. The lower surface of semiconductor substrate 101 is covered with ohmic contact layer 106.

As described above, the semiconductor heterostructure laser can be implemented by a monolithic and compact semiconductor device, which results in effective conversion of the fundamental light into the doubled frequency light. As a result, such a laser effectively emits high-frequency visible light.

While the invention has been described in conjunction with a few specific embodiments, it is evident to those skilled in the art that many alternatives, modifications and variations will be apparent in light of the foregoing description. Accordingly, the present invention is intended to embrace all such alternative modifications and variations as fall within the spirit and scope of the appended claims.

What is claimed is:

1. A semiconductor heterostructure laser comprising:
   a semiconductor substrate;
   a multilayered light emitting region formed on said semiconductor substrate, said multilayered light emitting region producing fundamental light of a fundamental frequency;
   an active nonlinear waveguide including at least one multilayered heterostructure, wherein said multilayered heterostructure has a resonator structure and absorbs said fundamental light to double said frequency thereof and thereby produce a doubled frequency light.

2. A semiconductor heterostructure laser according to claim 1, further comprising a first refractive mirror formed between said semiconductor substrate and said multilayered light emitting region, said first refractive mirror preventing propagation of said fundamental light from said multilayered light emitting region to said semiconductor substrate.

3. A semiconductor heterostructure laser according to claim 2, wherein said first refractive mirror comprises:
a plurality of first AlGaAs layers having a first conductivity, each having a first aluminum composition ratio; and
a plurality of second AlGaAs layers having the same conductivity with said first AlGaAs layers, each having a second aluminum composition ratio lower than said first aluminum composition ratio,
wherein said first AlGaAs layers and said second AlGaAs layers are alternately formed on said semiconductor substrate, with a superlattice structure.

4. A semiconductor heterostructure laser according to claim 1, further comprising a second refractive mirror between said multilayered light emitting region and said active nonlinear waveguide, said second refractive mirror preventing the propagation of said doubled frequency light from said active nonlinear waveguide to said multilayered light emitting region and allowing propagation of light from said multilayered light emitting region to said active nonlinear waveguide.

5. A semiconductor heterostructure laser according to claim 4, wherein said second refractive mirror comprises:
a plurality of third AlGaAs layers, each having a third aluminum composition ratio; and
a plurality of fourth AlGaAs layers, each having a fourth aluminum composition ratio higher than said third aluminum composition ratio,
wherein said third AlGaAs layers and said fourth AlGaAs layers are alternately formed on said multilayered light emitting region, with a superlattice structure.

6. A semiconductor heterostructure laser according to claim 1, wherein said multilayered light emitting region comprises:
at least one lower cladding layer doped with impurities of a first conductivity;
at least one light-emitting active layer for generating said fundamental light of said fundamental frequency; and
at least one upper cladding layer doped with impurities of a second conductivity, each having a larger band-gap than that of said light emitting active layer to transmit said fundamental light,
wherein said lower cladding layer, said light-emitting active layer and said upper cladding layer are sequentially and alternately formed over said semiconductor substrate.

7. A semiconductor heterostructure laser according to claim 6, wherein said lower cladding layer, said light-emitting active layer and said upper cladding layer each comprises AlGaAs.

8. A semiconductor heterostructure laser according to claim 6, said multilayered light emitting region further comprising a contact layer doped with impurities of said second conductivity, wherein a doping concentration of said contact layer is lower than that of said upper cladding layer.

9. A semiconductor heterostructure laser according to claim 1, wherein said multilayered heterostructure included in said active nonlinear waveguide comprises:

a first waveguide layer having a first refractive index;
a lasing active layer formed on said first waveguide layer, having a band-gap suitable for absorbing said fundamental light emitted from said multilayered light emitting region;
a second waveguide layer formed on said lasing active layer, having a second refractive index equal to said first refractive index; and
a third waveguide layer formed on said second waveguide layer, having a third refractive index lower than said first refractive index.

10. A semiconductor heterostructure laser according to claim 1, wherein said multilayered heterostructure included in said active nonlinear waveguide comprises:
a first waveguide layer having a first refractive index;
a second waveguide layer formed on said first waveguide layer, having a second refractive index higher than said first refractive index;
a lasing active layer formed on said second waveguide layer, having a band-gap suitable for absorbing said fundamental light emitted from said multilayered light emitting region;
a third waveguide layer formed on said lasing layer, having a third refractive index equal to said second refractive index; and
a fourth waveguide layer formed on said third waveguide layer, having a fourth refractive index equal to said first refractive index.

11. A semiconductor heterostructure laser according to claim 10, wherein said first, second, third and fourth waveguide layers comprise AlGaAs and said lasing active layer comprises InGaAs.

12. A semiconductor heterostructure laser according to claim 1, wherein said semiconductor substrate has a plane orientation of (111).

13. A semiconductor heterostructure laser according to claim 1, wherein said active nonlinear waveguide has a front facet and a rear facet, each coated with a dielectric multilayered mirror for reflecting said fundamental light.

14. A semiconductor heterostructure laser according to claim 1, further comprising:
a first refractive mirror disposed between said semiconductor substrate and said multilayered light emitting region, for preventing propagation of said fundamental light from said multilayered light emitting region to said semiconductor substrate; and
a second refractive mirror disposed between said multilayered light emitting region and said active nonlinear waveguide, for preventing the propagation of the doubled frequency light from said active nonlinear waveguide to said multilayered light emitting region,
wherein said second refractive mirror and said active nonlinear waveguide constitute a ridge structure.

15. A semiconductor heterostructure laser according to claim 14, further comprising:
an antireflection dielectric coating layer formed on an upper surface of said active nonlinear waveguide; and
an ohmic contact layer formed underneath said semiconductor substrate.

16. A semiconductor heterostructure laser comprising:
a semiconductor substrate;
a current blocking layer selectively formed on said semiconductor substrate to form a groove-shaped channel on top of the semiconductor substrate between the selectively formed current blocking layer;

a first refractive mirror formed on surfaces of said current blocking layer and said semiconductor substrate;

a multilayered light emitting region formed on said first refractive mirror, for producing fundamental light of a fundamental frequency;

a second refractive mirror formed on said multilayered light emitting region; and an active heterostructure, wherein said multilayered heterostructure has a resonator structure and absorbs said fundamental light to double the frequency thereof to produce a doubled frequency light, wherein said first refractive mirror prevents the propagation of said fundamental light from said multilayered light emitting region to said semiconductor substrate and wherein said second refractive mirror prevents the propagation of the doubled frequency light from said active nonlinear waveguide to said multilayered light emitting region and wherein said second refractive mirror and said active nonlinear waveguide constitute a ridge structure.

17. A semiconductor heterostructure laser according to claim 16, further comprising:

an antireflection dielectric coating layer formed on the upper surface of said active nonlinear waveguide;

a first ohmic contact layer formed underneath said semiconductor substrate; and a second ohmic contact layer selectively formed on the surface of said multilayered light emitting region.

18. A semiconductor heterostructure laser comprising:

a semiconductor substrate;

a current blocking layer selectively formed in said semiconductor substrate to form a raised channel of said semiconductor substrate between the selectively formed current blocking layer;

a first refractive mirror formed on surfaces of said current blocking layer and said semiconductor substrate, having a groove structure located over said raised channel of semiconductor substrate;

a multilayered light emitting region formed on said first refractive mirror, for producing fundamental light of a fundamental frequency;

a second refractive mirror formed on said multilayered light emitting region; and an active nonlinear waveguide including at least one multilayered heterostructure, wherein the multilayered heterostructure has a resonator structure and absorbs said fundamental light to double the frequency thereof and thereby produce a double frequency light, wherein said first refractive mirror prevents propagation of said fundamental light from said multilayered light emitting region to said semiconductor substrate and wherein said second refractive mirror prevents the propagation of the doubled frequency light from said active nonlinear waveguide to said multilayered light emitting region and wherein said second refractive mirror and said active nonlinear waveguide constitute a ridge structure.

19. A semiconductor heterostructure laser according to claim 18, further comprising:

an antireflection dielectric coating layer formed on an upper surface of said active nonlinear waveguide;

a first ohmic contact layer formed underneath said semiconductor substrate; and a second ohmic contact layer selectively formed on a surface of said multilayered light emitting region.

20. A semiconductor heterostructure laser comprising:

a semiconductor substrate;

a first ohmic contact layer formed on a lower surface of said semiconductor substrate;

a current blocking layer selectively formed on an upper surface of said semiconductor substrate to form a groove-shaped channel on top of the semiconductor substrate between the selectively formed current blocking layer;

a first refractive mirror formed on surfaces of said current blocking layer and said semiconductor substrate, while maintaining the grooved shape of said channel;

a multilayer light emitting region formed on said first refractive mirror, for producing fundamental light of a fundamental frequency, while maintaining the grooved shape of the channel;

an intermediate layer selectively formed on the center of an upper surface of said multilayered light emitting region;

a second ohmic contact layer selectively formed on the remainder of the said surface of said multilayered light emitting region not covered by said intermediate layer;

a second refractive mirror formed on an upper surface of the said intermediate layer;

an active nonlinear waveguide formed on an upper surface of the said second refractive mirror, including at least one multilayered heterostructure which has a resonator structure and absorbs said fundamental light to double the frequency of said fundamental light and thereby produce a doubled frequency light; and an antireflection dielectric coating layer formed on an upper surface of said active nonlinear waveguide, wherein said first refractive mirror prevents the propagation of said fundamental light from said multilayered light emitting region to said semiconductor substrate, said second refractive mirror prevents the propagation of the doubled frequency light from said active nonlinear waveguide to said multilayered light emitting region and said intermediate layer, said second refractive mirror and said active nonlinear waveguide constitute a ridge.

* * * * *